United States Patent
Fujii et al.

(10) Patent No.: US 10,594,110 B2
(45) Date of Patent: Mar. 17, 2020

(54) VERTICAL CAVITY SURFACE EMITTING LASER, METHOD FOR FABRICATING VERTICAL CAVITY SURFACE EMITTING LASER

(71) Applicant: SUMITOMO ELECTRIC INDUSTRIES, LTD., Osaka (JP)

(72) Inventors: Kei Fujii, Osaka (JP); Toshiyuki Tanahashi, Osaka (JP); Takashi Ishizuka, Osaka (JP); Susumu Yoshimoto, Osaka (JP); Takamichi Sumitomo, Osaka (JP); Koji Nishizuka, Osaka (JP); Suguru Arikata, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/189,794

(22) Filed: Nov. 13, 2018

(65) Prior Publication Data

US 2019/0148914 A1   May 16, 2019

(30) Foreign Application Priority Data

Nov. 16, 2017  (JP) ................................. 2017-220875

(51) Int. Cl.
*H01S 5/00* (2006.01)
*H01S 5/183* (2006.01)
(Continued)

(52) U.S. Cl.
CPC .......... *H01S 5/18358* (2013.01); *H01S 5/183* (2013.01); *H01S 5/18308* (2013.01);
(Continued)

(58) Field of Classification Search
CPC .. H01S 5/18327; H01S 5/3013; H01S 5/3054; H01S 5/0425; H01S 5/18313;
(Continued)

(56) References Cited

U.S. PATENT DOCUMENTS

| 2009/0008659 A1* | 1/2009 | Ohno | ..................... B82Y 20/00 |
| | | | 257/96 |
| 2009/0140286 A1* | 6/2009 | Takeda | ................ H01L 21/0237 |
| | | | 257/103 |

(Continued)

FOREIGN PATENT DOCUMENTS

JP     2008-108964    5/2008

*Primary Examiner* — Kinam Park
(74) *Attorney, Agent, or Firm* — Smith, Gambrell & Russell, LLP.

(57) ABSTRACT

A vertical cavity surface emitting laser includes: a supporting base having a principal surface including III-V compound semiconductor containing gallium and arsenic as constituent elements; and a post disposed on the principal surface. The post has a lower spacer region including a III-V compound semiconductor containing gallium and arsenic as group-III elements, and an active layer having a quantum well structure disposed on the lower spacer region. The quantum well structure has a concentration of carbon in a range of $2 \times 10^{16}$ cm$^{-3}$ or more to $5 \times 10^{16}$ cm$^{-3}$ or less. The quantum well structure includes a well layer and a barrier layer. The well layer includes a III-V compound semiconductor containing indium as a group-III element, and the barrier layer includes a III-V compound semiconductor containing indium and aluminum as group-III elements. The lower spacer region is disposed between the supporting base and the active layer.

5 Claims, 9 Drawing Sheets

(51) Int. Cl.
*H01S 5/30* (2006.01)
*H01S 5/343* (2006.01)
*H01S 5/042* (2006.01)

(52) U.S. Cl.
CPC ........ H01S 5/18327 (2013.01); H01S 5/3013 (2013.01); H01S 5/3054 (2013.01); *H01S 5/0425* (2013.01); *H01S 5/18313* (2013.01); *H01S 5/343* (2013.01); *H01S 5/34313* (2013.01); *H01S 5/34353* (2013.01); *H01S 2304/04* (2013.01)

(58) Field of Classification Search
CPC .. H01S 5/34313; H01S 5/34353; H01S 5/343; H01S 5/18308; H01S 5/183; H01S 2304/04
See application file for complete search history.

(56) References Cited

U.S. PATENT DOCUMENTS

2011/0114916 A1* 5/2011 Yoshizumi ............ B82Y 20/00
257/13
2013/0009202 A1* 1/2013 Enya ...................... H01L 33/32
257/103

* cited by examiner ature profile and a gas

VERTICAL CAVITY SURFACE EMITTING LASER, METHOD FOR FABRICATING VERTICAL CAVITY SURFACE EMITTING LASER

BACKGROUND OF THE INVENTION

Field of the Invention

The present invention relates to a vertical cavity surface emitting laser and a method for fabricating a vertical cavity surface emitting laser. This application claims the benefit of priority from Japanese Patent application No. 2017-220875 filed on Nov. 16, 2017, which is herein incorporated by reference in its entirety.

Related Background Art

Japanese Unexamined Patent Publication No. 2008-108964, referred to as Patent Document 1, discloses a light emitting diode.

SUMMARY OF THE INVENTION

A vertical cavity surface emitting laser according to one aspect of the present invention includes: a supporting base having a principal surface including III-V compound semiconductor containing gallium and arsenic as constituent elements; and a post disposed on the principal surface. The post has a lower spacer region and an active layer. The lower spacer region includes III-V compound semiconductor containing gallium and arsenic as group-III elements. The active layer has a quantum well structure disposed on the lower spacer region. The quantum well structure has a concentration of carbon in a range of $2 \times 10^{16}$ cm$^{-3}$ or more to $5 \times 10^{16}$ cm$^{-3}$ or less. The quantum well structure includes a well layer and a barrier layer. The well layer includes III-V compound semiconductor containing indium as a group-III element. The barrier layer includes III-V compound semiconductor containing indium and aluminum as group-III elements, and the lower spacer region is disposed between the supporting base and the active layer.

A method for fabricating a vertical cavity surface emitting laser according to the another aspect includes: preparing a substrate including III-V compound semiconductor containing gallium and arsenic as constituent elements; growing a semiconductor laminate for a lower Bragg distributed reflector on a principal surface of the substrate at a substrate temperature of 670 degrees Celsius or more; supplying a raw material containing organometallic material to a growth reactor to grow a first semiconductor layer on the semiconductor laminate at a substrate temperature of 590 degrees Celsius or less, the first semiconductor layer containing aluminum as a group-III constituent element and not containing indium as a group-III constituent element; and supplying a raw material containing organometallic material to a growth reactor to grow a second semiconductor layer for an active layer on the first semiconductor layer at a substrate temperature of 590 degrees Celsius or less, the second semiconductor layer containing indium as a group-III constituent element.

BRIEF DESCRIPTION OF THE DRAWINGS

The above-described objects and the other objects, features, and advantages of the present invention become more apparent from the following detailed description of the preferred embodiments of the present invention proceeding with reference to the attached drawings.

DESCRIPTION OF THE EMBODIMENTS

Figure 1:
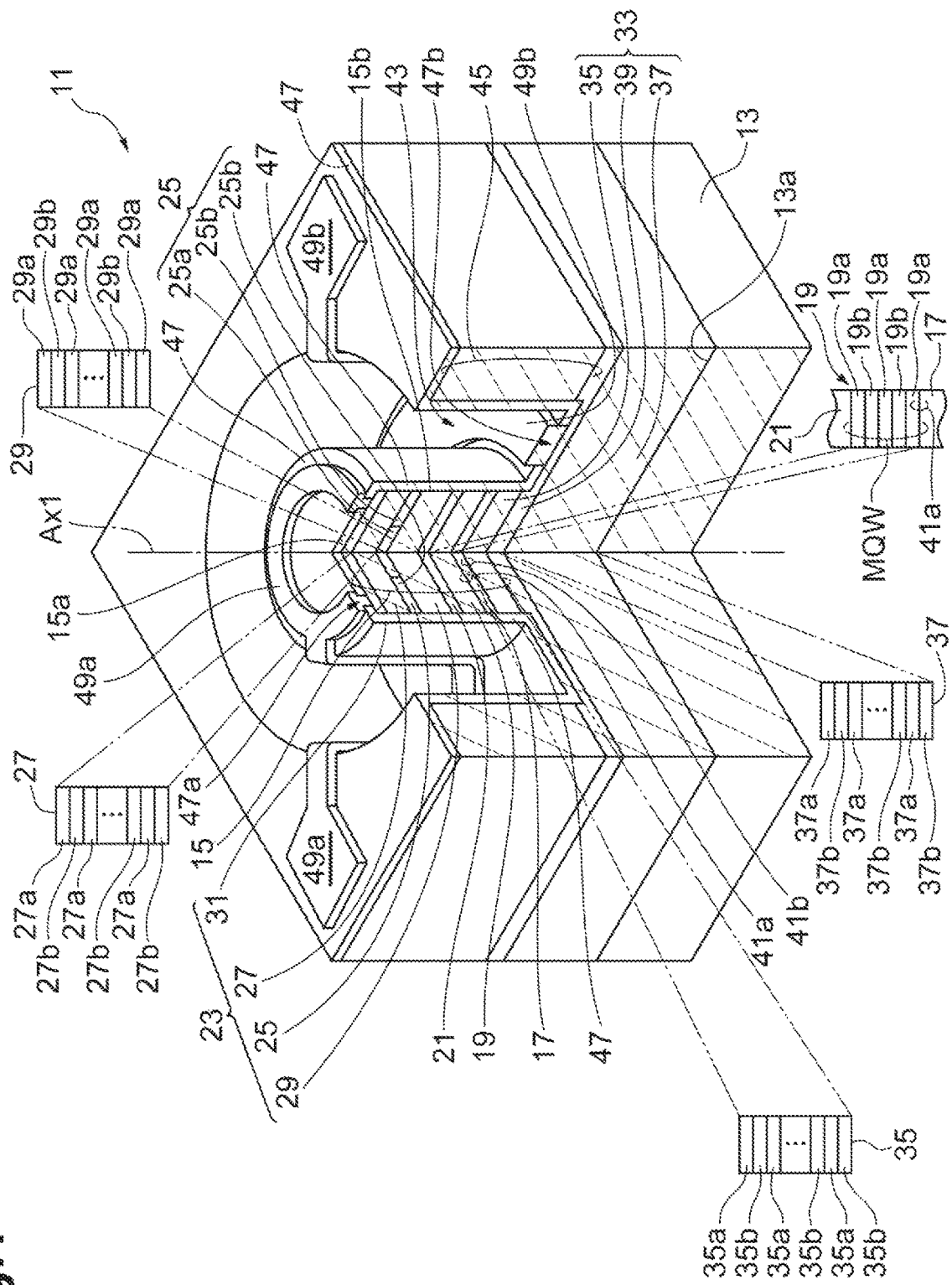
FIG. 1 is a partially broken perspective view showing a vertical cavity surface emitting laser according to an embodiment.

The light-emitting diode of Patent Document 1 has an $(Al_{0.7}Ga_{0.3})_{0.5}In_{0.5}P$ lower cladding layer, an $(Al_{0.7}Ga_{0.3})_{0.5}In_{0.5}P$ upper cladding layer, a GaP current-diffusing layer, and a bulk active layer of $(Al_{0.2}Ga_{0.8})_{0.5}In_{0.5}P$ or a multiple quantum well active layer including an $(Al_{0.2}Ga_{0.8})_{0.5}In_{0.5}P$ well layer and an $(Al_{0.5}Ga_{0.5})_{0.5}In_{0.5}P$ barrier layer.

The light emitting diode of Patent Document 1 is different from a vertical cavity surface emitting laser. Patent Document 1 does not disclose the occurrence of indium segregation in the active layer and the progression of indium segregation due to energization.

It is an object according to one aspect of the present invention to provide a vertical cavity surface emitting laser which has an improved reliability. It is an object according to another aspect of the present invention to provide a method for fabricating a vertical cavity surface emitting laser allowing the improvement of reliability.

A description will be given of examples.

A vertical cavity surface emitting laser according to an example includes: (a) a supporting base having a principal surface including III-V compound semiconductor containing gallium and arsenic as constituent elements; and (b) a post disposed on the principal surface. The post has a lower spacer region and an active layer. The lower spacer region includes a III-V compound semiconductor containing gallium and arsenic as group-III elements. The active layer has a quantum well structure disposed on the lower spacer region. The quantum well structure has a concentration of carbon in a range of $2\times10^{16}$ cm$^{-3}$ or more to $5\times10^{16}$ cm$^{-3}$ or less. The quantum well structure includes a well layer and a barrier layer. The well layer includes a III-V compound semiconductor containing indium as a group-III element. The barrier layer includes a III-V compound semiconductor containing indium and aluminum as group-III elements, and the lower spacer region is disposed between the supporting base and the active layer.

The vertical cavity surface emitting laser is provided with the active layer, which has a carbon concentration in the range of $2\times10^{16}$ cm$^{-3}$ to $5\times10^{16}$ cm$^{-3}$ and includes a well layer made of III-V compound semiconductor that contains indium as a group-III element and does not contain nitrogen as a group-V element. The well layer of such an indium-containing semiconductor can reduce fluctuations, progressing during a long-term energization thereof, in electrical characteristics thereof.

The vertical cavity surface emitting laser according to an example further includes a lower laminate having semiconductor layers for a lower Bragg distributed reflector disposed on the supporting base. The principal surface of the supporting base includes GaAs. The lower laminate is disposed between the lower spacer region and the supporting base. The lower spacer region is in contact with the lower laminate, and the III-V compound semiconductor of the lower spacer region includes an AlGaAs layer in contact with the active layer.

The vertical cavity surface emitting laser is provided with the active layer that is grown on the AlGaAs layer of the lower spacer region.

In the vertical cavity surface emitting laser according to an example, the quantum well structure has an AlGaInAs well layer and an AlGaAs barrier layer.

The vertical cavity surface emitting laser is provided with the well layer of AlGaInAs exhibiting low indium segregation.

A method for fabricating a vertical cavity surface emitting laser according to an example includes: (a) preparing a substrate including a III-V compound semiconductor containing gallium and arsenic as constituent element; (b) growing a semiconductor laminate for a lower distributed Bragg reflector on a principal surface of the substrate at a substrate temperature of 670 degrees Celsius or more; (c) supplying a raw material containing organometallic material to a growth reactor to grow a first semiconductor layer on the semiconductor laminate at a substrate temperature of 590 degrees Celsius or less, the first semiconductor layer containing aluminum as a group-III constituent element and not containing indium as a group-III constituent element; and (d) supplying a raw material containing organometallic material to a growth reactor to grow a second semiconductor layer for an active layer on the first semiconductor layer at a substrate temperature of 590 degrees Celsius or less, the second semiconductor layer containing indium as a group-III constituent element.

The method for fabricating the vertical cavity surface emitting laser can provide a crystalline base for the growth of the active layer with a low surface roughness which is made smaller than that of surface steps coining from a slight inclination of the principal surface of the substrate. Specifically, the growth of crystal at a substrate temperature of 590 degrees Celsius or less allows the crystal thus grown to have a surface roughness lower than the density and height of surface steps on the principal surface of the substrate. The lower surface roughness itself can make difference in the non-uniform distribution of indium on the crystalline base reduced. In addition, the indium-containing semiconductor of the well layer is grown on the crystalline base at a substrate temperature of 590 degrees Celsius or lower. The substrate temperature of 590 degrees Celsius or lower can suppress the migration of indium atoms during the growth of the indium-containing semiconductor to reduce unevenness in the distribution of indium thereon. The low surface roughness of the crystalline base and the low migration during the growth can provide the indium-containing semiconductor of the well layer with a low segregation of indium. The well layer of the indium-containing semiconductor can prevent the indium segregation under a long time of energization from growing large in the active layer.

In the method according to an example, the quantum well structure has a concentration of carbon ranging from $2\times10^{16}$ cm$^{-3}$ to $5\times10^{16}$ cm$^{-3}$.

In the method for fabricating the vertical cavity surface emitting laser, providing the indium-containing semiconductor with a carbon concentration exceeding $5\times10^{16}$ cm$^{-3}$ may cause the indium-containing semiconductor to lose the advantageous effect, which arises from the underlying steps, thereby making the crystal quality thereof deteriorated. Carbon concentrations of less than $2\times10^{16}$ cm$^{-3}$ also indicate that the indium-containing semiconductor does not incorporate so much amount of carbon during the growth. This low capacity of the incorporation is associated with a sufficient decomposition of raw material in the growth at a substrate temperature, and the stepwise surface, which is derived from the slight inclination of the principal surface of the base, is likely to appear on the updated growth face in growing the underlying crystal. Providing an indium-containing semiconductor with a carbon concentration of $2\times10^{16}$ cm$^{-3}$ or more allows the indium-containing semiconductor to have a structure that can incorporate indium atoms during the growth such that the redistribution of the indium atoms caused by their migration during energization is less likely to change laser characteristics.

Teachings of the present invention can be readily understood by considering the following detailed description with reference to the accompanying drawings shown as examples. Referring to the accompanying drawings, embodiments of a vertical cavity surface emitting laser, and a method for fabricating a vertical cavity surface emitting laser according to the present invention will be described below. To facilitate understanding, identical reference numerals are used, where possible, to designate identical elements that are common to the figures.

FIG. 1 is a partially broken perspective view showing a vertical cavity surface emitting laser according to the embodiment. The vertical cavity surface emitting laser 11 includes a supporting base 13 and a post 15. The supporting base 13 has a principal face 13a, and the principal face 13a includes a III-V compound semiconductor containing Ga and As as constituent elements. The supporting base 13 and the post 15 are arranged in the direction of the first axis Ax1. The post 15 is disposed on the principal surface 13a of the supporting base 13 and includes an upper face 15a and a side face 15b. Referring to FIG. 1, the post 15 has an illustrative structure of a cylindrical shape, but the shape of the post 15 is not limited thereto. The post 15 includes a lower spacer region 17 and an active layer 19. The active layer 19 is disposed on the lower spacer region 17, and has a quantum well structure MQW. The quantum well structure MQW includes well layers 19a and barrier layers 19b, which are alternately arranged in the direction of the first axis Ax1. The well layers 19a each include a III-V compound semiconductor containing indium (In) as a group-III element. This III-V compound semiconductor further includes aluminum (Al) and gallium (Ga) as group-III elements. The barrier layers 19b each include a III-V compound semiconductor containing aluminum (Al) and gallium (Ga) as group-III elements. The III-V compound semiconductors of the well and barrier layers 19a and 19b each do not contain nitrogen (N) as a group-V element but contain arsenic (As) as a group-V element. The lower spacer region 17 includes a III-V compound semiconductor containing gallium (Ga) and arsenic (As) as constituent elements, and the lower spacer region 17 may be made of III-V compound semiconductor that contains Ga and Al as group-III elements and As as a group-V element, such as AlGaAs. The lower spacer region 17 has a bandgap which is larger than that of the well layer 19a. The active layer 19 has a carbon concentration of $2\times10^{16}$ cm$^{-3}$ or more, and $5\times10^{16}$ cm$^{-3}$ or less. The active layer 19 is provided with the indium-containing semiconductor that incorporates carbon at a carbon concentration of $2\times10^{16}$ cm$^{-3}$ or more, so that the indium-containing semiconductor having a carbon concentration in the range can make laser characteristics thereof less sensitive to redistribution of indium atoms that occurs in the indium-containing semiconductor by migration during the operation. The indium-containing semiconductor has a carbon concentration of $5\times10^{16}$ cm$^{-3}$ or less, the upper limit of which allows the active layer to have a desired crystal quality thereof. This carbon concentration can be measured, for example, by secondary ion mass spectrometry (SIMS) and can be an average value over the entire active layer 19.

The active layer 19, which has a carbon concentration in the range of $2\times10^{16}$ cm$^{-3}$ to $5\times10^{16}$ cm$^{-3}$, allows the indium-containing semiconductor of the well layer, which includes a III-V compound semiconductor with indium as a group-III element and without nitrogen as a group-V element, to reduce variations in electrical characteristics of the vertical cavity surface emitting laser 11 during a long-term energization.

The inventors' findings reveal that the application of a long-term energization to the vertical cavity surface emitting laser 11, for example, a GaAs-based vertical cavity surface emitting laser varies electrical characteristics thereof and that the variations are associated with indium (In) segregation in the active layer. The inventors' experiments reveal that the active layer 19 of a carbon concentration in the range of $2\times10^{16}$ or more and $5\times10^{16}$ cm$^{-3}$ or less can make the variations in electrical characteristics of the vertical cavity surface emitting laser 11 low. Using crystal that incorporates carbon in a range of $2\times10^{16}$ to $5\times10^{16}$ cm$^{-3}$ in the active layer that contains indium as a constituent element makes the progression of In segregation, which may be caused during operation, reduced.

The quantum well structure MQW can include, for example, an AlGaInAs well layer and an AlGaAs barrier layer. The AlGaInAs well layer provides a low In segregation with the vertical cavity surface emitting laser 11.

In the vertical cavity surface emitting laser 11, the post 15 may further include an upper spacer region 21, which includes a III-V compound semiconductor containing Ga and As as constituent elements. The upper spacer region 21 may include a III-V compound semiconductor containing Ga and Al as group-III elements and As as a group-V element, such as AlGaAs.

The post 15 further includes an upper laminate 23, which includes semiconductor layers for the upper distributed Bragg reflector, disposed on the active layer 19. The upper laminate 23 may include a current confinement structure 25. The current confinement structure 25 is provided with a conductive region 25a of Al-containing III-V semiconductor, and an insulating region 25b of oxide that contains a constituent element(s) of the group III-V semiconductor. Specifically, the upper laminate 23 is provided with the first and second upper laminate portions 27 and 29, which are arranged to form the upper distributed Bragg reflector. The upper laminate 23 is provided with the current confinement structure 25. If necessary, the upper laminate 23 further includes an upper contact layer 31, which forms the upper face of the upper laminate 23.

The vertical cavity surface emitting laser 11 further includes a lower laminate 33, which includes semiconductor layers for a lower distributed Bragg reflector disposed on the principal surface 13a of the supporting base 13. In the present embodiment, the post 15 includes a part of the lower laminate 33, which is disposed between the lower spacer region 17 and the supporting base 13, specifically, a laminate 35 which is a part of the lower distributed Bragg reflector. In addition to the first lower laminate 35, the lower laminate 33 may further include a second lower laminate 37 and, if necessary, may include a lower contact layer 39. The lower contact layer 39 is disposed between the first lower laminate 35 and the second lower laminate 37.

The present embodiment may provide the vertical cavity surface emitting laser 11 with a groove 43 and a terrace 45, and the groove 43 separates the post 15 from the terrace 45 to form the post 15. The terrace 45 has substantially the same semiconductor laminate as that of the post 15. The post 15 is provided with the upper portion of the lower contact layer 39, and the lower portion of the lower contact layer 39 is disposed outside the post 15 to extend along the principal surface of the supporting base 13. The lower part of the lower contact layer 39 provides the bottom face of the groove 43.

The vertical cavity surface emitting laser 11 further includes a protective film 47, which covers the top and side faces of the post 15, the groove 43 and the terrace 45. The protective film 47 includes a silicon-based inorganic insulating film, such as SiON and SiN, and includes a first opening 47a and a second opening 47b. In an example, the first opening 47a is located on the upper face of the post 15, and the second opening 47b is located, for example, on the bottom face of the groove 43. The vertical cavity surface emitting laser 11 includes an upper electrode 49a and a lower electrode 49b. The upper and lower electrodes 49a and 49b make contact with the upper and lower contact layers 31 and 39 via the first and second openings 47a and 47b, respectively.

The active layer 19 is disposed between the lower and second spacer regions 17 and 21. The lower spacer region 17, the active layer 19 and the upper spacer region 21 are disposed between the upper and lower laminates 23 and 33. In the present embodiment, the supporting base 13, the lower laminate 33, the lower spacer region 17, the active layer 19, the upper spacer region 21, and the upper laminate 23 are arranged in the direction of the first axis Ax1.

In the present embodiment, the lower spacer region 17 makes contact with an outermost well layer 19a of the active layer 19 to form the first interface 41a, and the lower laminate 33 makes contact with the lower spacer region 17 to form the second interface 41b. The first interface 41a may be characterized in a roughness that is defined as the surface roughness (for example, an RMS value) of the lower spacer region 17, and the second interface 41b may be characterized in a roughness that is defined as the surface roughness (for example, an RMS value) of the lower laminate 33. The first interface 41a is provided with the above roughness larger than that of the second interface 41b of the lower laminate 33.

In the present embodiment, the upper laminate 23 is provided with the first and second upper laminates 27 and 29 for the upper distributed Bragg reflector. Specifically, the first upper laminate 27 includes multiple first upper layers 27a and multiple second upper layers 27b, which are alternately arranged to enable distributed Bragg reflection. In the first upper laminate 27, each of the first upper layers 27a includes a first semiconductor region containing Al and Ga as group-III elements, and a first insulating region, which encircles the first semiconductor region and is made of oxide of a constituent element(s) of the first semiconductor region. This oxide region extends inward from the side face 15b of the post 15 toward the center of the post 15 to reach the first semiconductor region. In the first upper laminate 27, each of the second upper layers 27b includes a second semiconductor region containing Al and Ga as group-III elements and a second insulating region that encircles the second semiconductor region and is made of oxide of a constituent element(s) of the second semiconductor region. This oxide extends inward from the side face 15b of the post 15 toward the center of the post 15 to reach the second semiconductor region. These oxide regions penetrate to respective depths, which are associated with Al compositions of the first and second semiconductor regions, to distance the first and second semiconductor regions from the side face of the post 15. The first semiconductor region of the first upper layer 27a has a refractive index different from that the second semiconductor region of the second upper layer 27b, and the first and second upper layers 27a and 27b provide the first and second semiconductor regions with the respective refractive indices, the difference between which depends on, for example, the respective aluminum compositions thereof. In this example, the Al composition of the first semiconductor region is larger than that of the second semiconductor region.

The second upper laminate 29 includes multiple first upper layers 29a and multiple second upper layers 29b, which are alternately arranged to enable distributed Bragg reflection. In the second upper laminate 29, each of the first upper layers 29a includes a first semiconductor region that contains Al and Ga as group-III elements and a first insulating region that encircles the first semiconductor region and is made of oxide of a constituent element of the first semiconductor region. This oxide extends from the side face 15b of the post 15 toward the center of the post 15 to reach the first semiconductor region. Each of the second upper layers 29b includes a second semiconductor region containing Al and Ga as group-III elements and a second insulating region that encircles the second semiconductor region and is made of oxide of a constituent element of the second semiconductor region. This oxide extends from the side face 15b of the post 15 toward the center of the post 15 to reach the second semiconductor region. These oxide regions penetrate to respective depths, which are associated with Al compositions of the first and second semiconductor regions, to distance the first and second semiconductor regions from the side face of the post 15. The first semiconductor region of the first upper layer 29a has a refractive index different from that of the second semiconductor region of the second upper layer 29b, and the first and second upper layers 29a and 29b provide the first and second semiconductor regions with the respective refractive indices, the difference between which depends on, for example, the respective aluminum compositions thereof. In this example, the Al composition of the first semiconductor region is larger than the Al composition of the second semiconductor region.

In the current confinement structure 25, the conductive region 25a has an Al composition, which is larger than that of the first semiconductor region of the first upper layer 27a of the first upper laminate 27 and that of the first semiconductor region of the first upper layer 29a of the second upper laminate 29. The vertical cavity surface emitting laser 11 may be provided with distortion left in the post 15 and caused by the conductive region 25a and the insulating region 25b of the current confinement structure 25.

In the present embodiment, the lower laminate 33 includes a first lower laminate 35 and a second lower laminate 37 for the lower distributed Bragg reflector. Specifically, the first lower laminate 35 includes multiple first lower layers 35a and multiple second lower layers 35b, which are alternately arranged to enable distributed Bragg reflection. In the first lower laminate 35, each of the first lower layers 35a includes a first semiconductor region containing Al and Ga as group III elements, and may include a first insulating region that encircles the first semiconductor region and is made of oxide of a constituent element of the first semiconductor region. This oxide extends inward from the side face 15b of the post 15 toward the center of the post 15 to reach the first semiconductor region. Each of the second lower layers 35b includes a second semiconductor region containing Al and Ga as group-III elements, and may include a second insulating region that encircles the second semiconductor region and is made of oxide of a constituent element of the second semiconductor region. This oxide extends inward from the side face 15b of the post 15 toward the inside of the post 15 to reach the second semiconductor region. These oxide regions penetrate to respective depths, which are associated with Al compositions of the first and second semiconductor regions, to distance the first and second semiconductor regions from the side face of the post 15. The first semiconductor region of the first lower layer 35a has a refractive index different from that of the second semiconductor region of the second lower layer 35b, and the first and second lower layers 35a and 35b provide the first and second semiconductor regions with the respective refractive indices, the difference between which depends on, for example, the aluminum compositions thereof. In this example, the Al composition of the first semiconductor region is larger than the Al composition of the second semiconductor region.

The second lower laminate 37 includes multiple first lower layers 37a and multiple second lower layers 37b, which are alternately arranged to enable distributed Bragg reflection. In the second lower laminate 37, each of the first lower layers 37a includes a first semiconductor region containing Al and Ga as group III elements, and each of the second lower layers 37b includes a second semiconductor region containing Al and Ga as group III elements. The first semiconductor region of the first lower layer 37a has a refractive index different from that of the second semiconductor region of the second lower layer 37b, and the first and second lower layers 37a and 37b provide the first and second semiconductor regions with the respective refractive indices, the difference between which depends on the aluminum composition difference therebetween. In this example embodiment, the first semiconductor region has an Al composition larger than that of the second semiconductor region.

An exemplary vertical cavity surface emitting laser 11
Supporting base 13: a slightly tilted-off GaAs substrate.

The principal face 13a of the supporting base 13 is inclined in the <110> direction with reference to the (001) plane of GaAs.

First and second lower laminates 35 and 37 of lower laminate 33.

First layer 37a/second layer 37b: alternate arrangement of undoped Al(x)Ga(1-x)As/Al(y)Ga(1-y)As, (composition: $0.8<x\leq1$, and $0.1\leq y\leq 0.3$)

Lower contact layer 39: Si-doped n-type AlGaAs.

First layer 35a/second layer 35b: alternate arrangement of Si-doped Al(x)Ga(1-x)As/Al(y)Ga(1-y)As, (composition: $0.8\leq x\leq 1$, $0.1\leq y\leq 0.3$).

The number of cycles in the first and second lower laminates 35 and 37 is 25 in total.

Lower spacer region 17: Al(z)Ga(1-z)As layer ($0.1<z<0.4$) grown as undoped and having a thickness of 5 to 25 nm.

The lower spacer region 17 has a surface roughness of 0.25 nm or less in root mean square (RMS) on the upper face. The epitaxial substrate, which is unloaded without growing the active layer from the growth reactor after growing the lower spacer region 17 in the fabricating process, is measured with an atomic force microscope (AFM) to obtain a surface roughness of the top surface thereof.

Quantum well structure MQW of the active layer 19 Well layer 19a/barrier layer 19b: undoped AlGaInAs well layer/AlGaAs barrier layer.

Well layer 19a: an Al composition of 0.01 to 0.08, an In composition of 0.08 to 0.18, and a thickness of 2 to 7 nm.

Barrier layer 19b: an Al composition of 0.1 to 0.4, and a thickness 5 to 9 nm.

The active layer 19 has a carbon concentration of 2 to $5\times10^{16}$ cm$^{-3}$ averaged over the well layers 19a and the barrier layers 19b. A profile of carbon concentration in depth is measured by secondary ion mass spectrometry (SIMS)

Upper spacer region 21: Al(z)Ga(1-z)As layer (having a composition of $0.1<z<0.4$) grown as undoped, with a thickness of 5 to 25 nm.

Current confinement structure 25
Conductive region 25a: AlAs or AlGaAs (with an Al composition of 0.98)
Insulating region 25b: aluminum oxide and/or gallium oxide First and second upper laminates 27 and 29 of the upper laminate 23

First upper layers 27a/second upper layers 27b: alternately arranged C-doped Al(u)Ga(1-u)As/Al(v)Ga(1-v)As (with compositions of $0.8<u\leq 1.0$ and $0.1\leq v<0.3$) First upper layer 29a/second upper layer 29b: alternately arranged C-doped Al(u)Ga(1-u)As/Al(v)Ga(1-v)As (with compositions of $0.8<u\leq 1.0$ and $0.1\leq v<0.3$)

The first and second upper laminates 27 and 29 have the number of 23 cycles in total.

Upper contact layer 31: C-doped p-type AlGaAs.
P-electrode (49a): Ti/Pt.
N-electrode (49b): for example Au/Ge/Ni.

Figure 2:
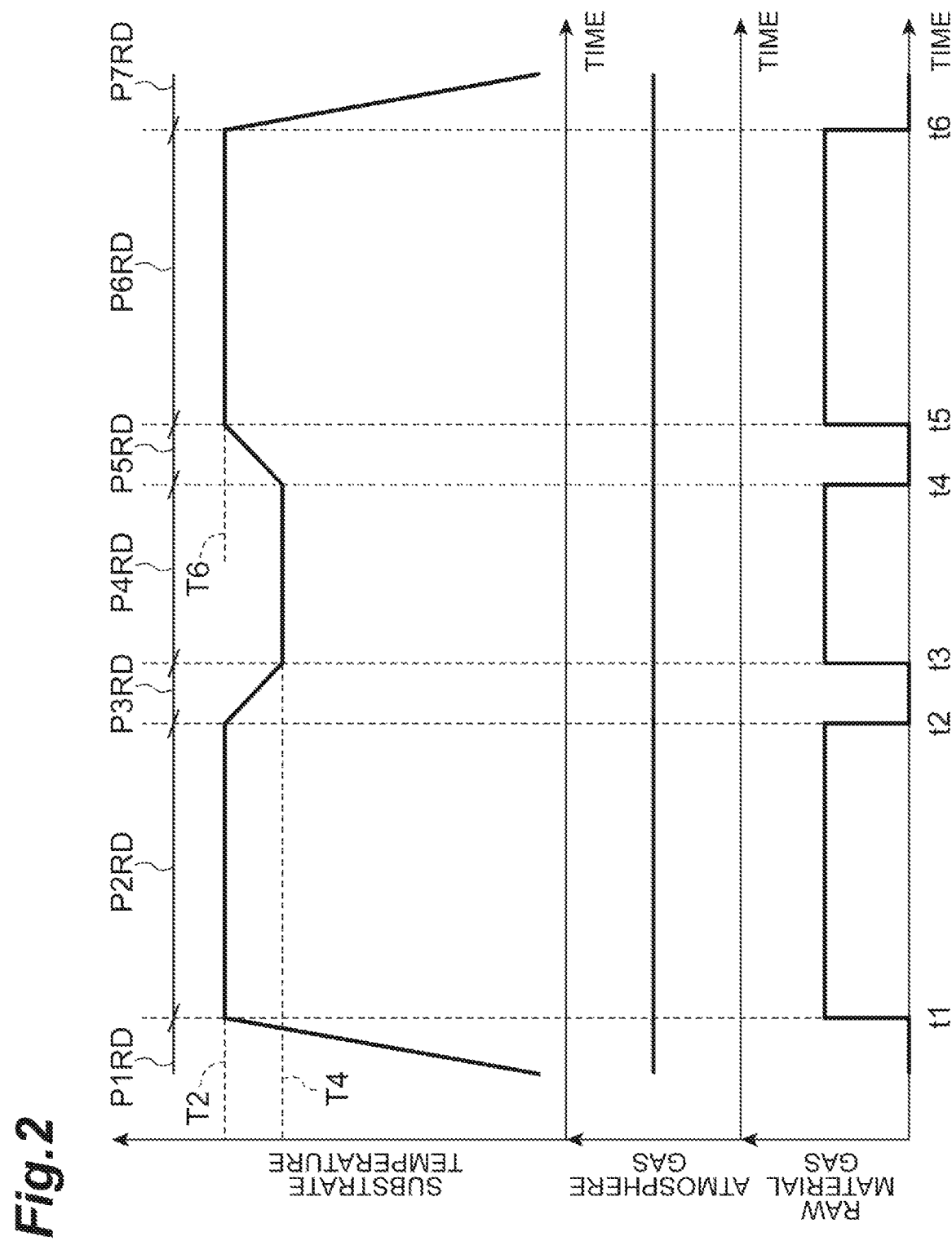
FIG. 2 is a view showing a temperature profile and a gas switching sequence in epitaxial growth according to the embodiment.

A description will be given of a method for fabricating a vertical cavity surface emitting laser with reference to FIGS. 2, 3A and 3B, FIGS. 4A and 4B, FIGS. 5A and 5B, and FIGS. 6A and 6B. FIG. 2 is a view showing a temperature profile and a gas-switching sequence in the epitaxial growth.

FIGS. 3A to 6B are schematic views each showing a major step in the method according to the embodiment.

Referring to FIG. 2, the epitaxial growth process includes a temperature rise P1RD, a bottom laminate growth P2RD, a growth interruption P3RD, an intermediate laminate (spacer region and active layer) growth P4RD, a growth interruption P5RD, a top laminate growth P6RD, and a temperature drop P7RD. The crystal growth can use, for example, the following raw materials: the Al raw material includes trimethyl aluminum (TMAl); the Ga raw material includes trimethyl gallium (TMGa); and the arsenic raw material includes arsine (AsH$_3$). The dopant gas for n-type conductivity includes silane (SiH$_4$). The dopant gas for p-type conductivity includes carbon tetrabromide (CBr$_4$).

Figure 3A:
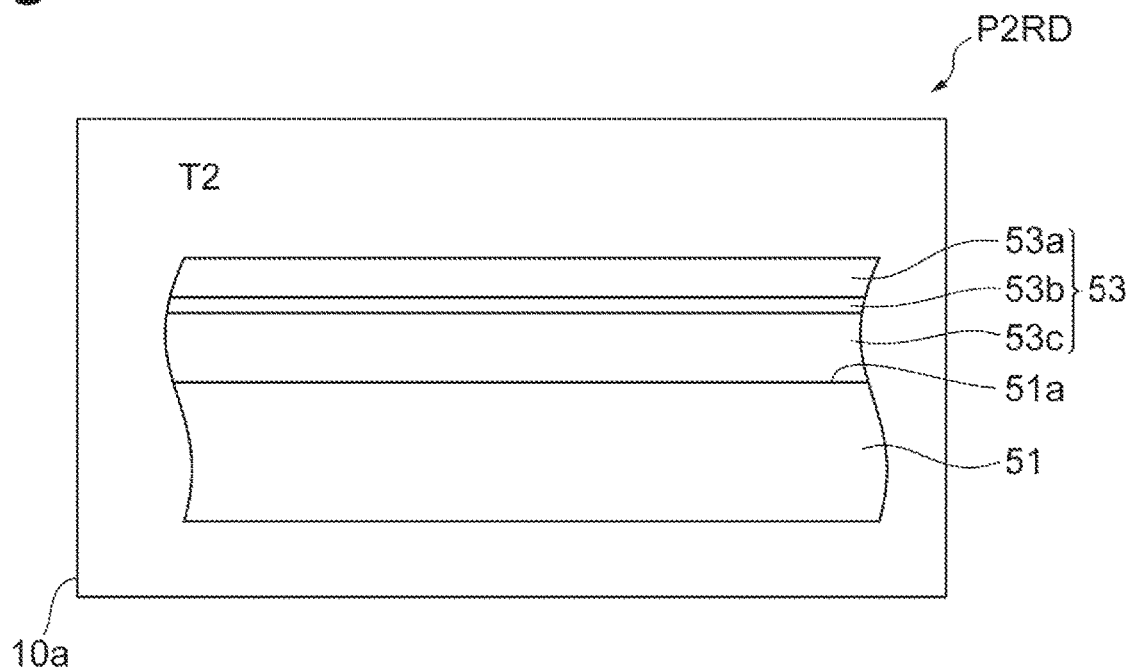
FIG. 3A is a schematic view showing a major step in a method for fabricating a vertical cavity surface emitting laser according to the embodiment.

As shown in FIG. 3A, a substrate 51 is prepared for growth, and specifically, the substrate 51 is made of III-V compound semiconductor containing Ga and As as constituent elements. In the embodiment, the substrate 51 (for example, a GaAs wafer) thus prepared is loaded to a growth reactor 10a. The growth reactor 10a enables metalorganic vapor phase epitaxy.

As shown in FIG. 3A, the growth reactor 10a increases the stage temperature (hereinafter referred to as "substrate temperature") so as to reach the substrate temperature (T2) for growth of the lower laminate 53 during the period P1RD of temperature rise. In the present embodiment, the lower laminate 53 includes a semiconductor layer for the lower laminate 33, specifically, a semiconductor layer (53a, 53b, and 53c) for the first lower laminate 35, the lower contact layer 39 and the second lower laminate 37. After the substrate temperature reaches the target temperature, in the period P2RD of the growth of the lower laminate, the growth reactor 10a starts to supply a raw material gas containing organic metal material to a chamber at the time t1, and switches gas at the time t2 to stop the growth of the lower laminate 53.

The lower laminate 53 includes, for example, a GaAs layer and/or an AlGaAs semiconductor layer.

Exemplary growth conditions are as follows:
Substrate temperature for semiconductor crystal growth: 670 to 750 degrees Celsius;
Molar ratio of group-V raw material to group-III raw material: V/III ratio of 100/160; and
Growth rate: 0.4 to 0.7 nm/sec.

Accordingly, the lower laminate 53, which includes semiconductor layers for the lower distributed Bragg reflector, is grown on the principal surface 51a of the substrate 51 at a substrate temperature of 670 degrees Celsius or higher.

Figure 3B:
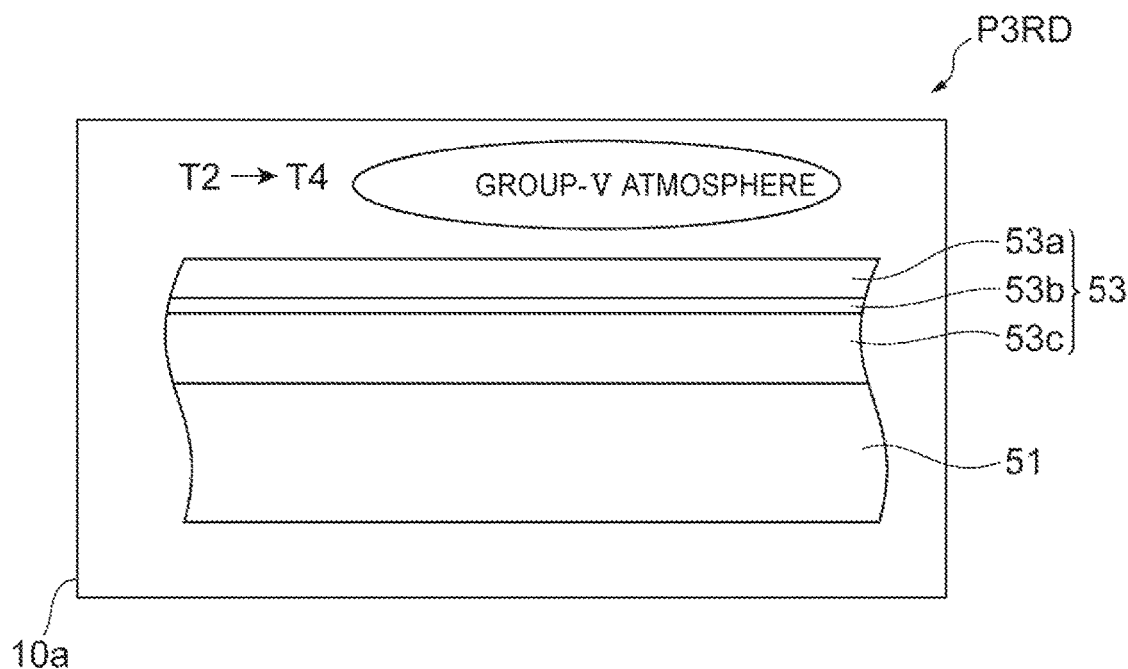
FIG. 3B is a schematic view showing a major step in the method according to the embodiment.

As shown in FIG. 3B, the growth interruption P3RD is given to preparation for growing the intermediate laminate 57 on the lower laminate 53. Specifically, the growth reactor 10a lowers the substrate temperature from the growth temperature (T2) of 670 degrees Celsius or more to a target temperature (T4) of 590 degrees Celsius or less. In this growth interruption, the growth reactor 10a supplies an arsenic source (group-V material) without supplying any group-III organometallic material to form an arsenic atmosphere.

Atmospheric gas: arsine as group-V material.
Rate of temperature change: 10 to 30 degree per minute.
Period of growth interruption: 3 to 20 minutes. During this growth interruption P3RD, the surface (e.g., Al(y)Ga(1-y)As with a composition of $0.1\leq y<0.3$) of the lower laminate 53 is exposed to an arsenic atmosphere at a temperature lower than the growth temperature to keep surface steps of the lower laminate 53, which is formed during the high temperature growth.

In the period P4RD of growth of the intermediate laminate (the spacer region and the active layer), the growth reactor 10a starts to supply a deposition gas containing the organometallic material at time t3 to grow the intermediate laminate 57 at the target temperature, given to the substrate after the fall of the substrate temperature, and stops supplying the deposition gas at time t4 to complete the intermediate laminate 57. The intermediate laminate 57 includes semiconductor layers (57a, 57b, and 57c) for the lower spacer region 17, the active layer 19 (well layers 19a and barrier layers 19b), and the upper spacer region 21. The growth interruption P3RD is used to lower the substrate temperature to a lower temperature that allows the subsequent growth of crystal.

Figure 4A:
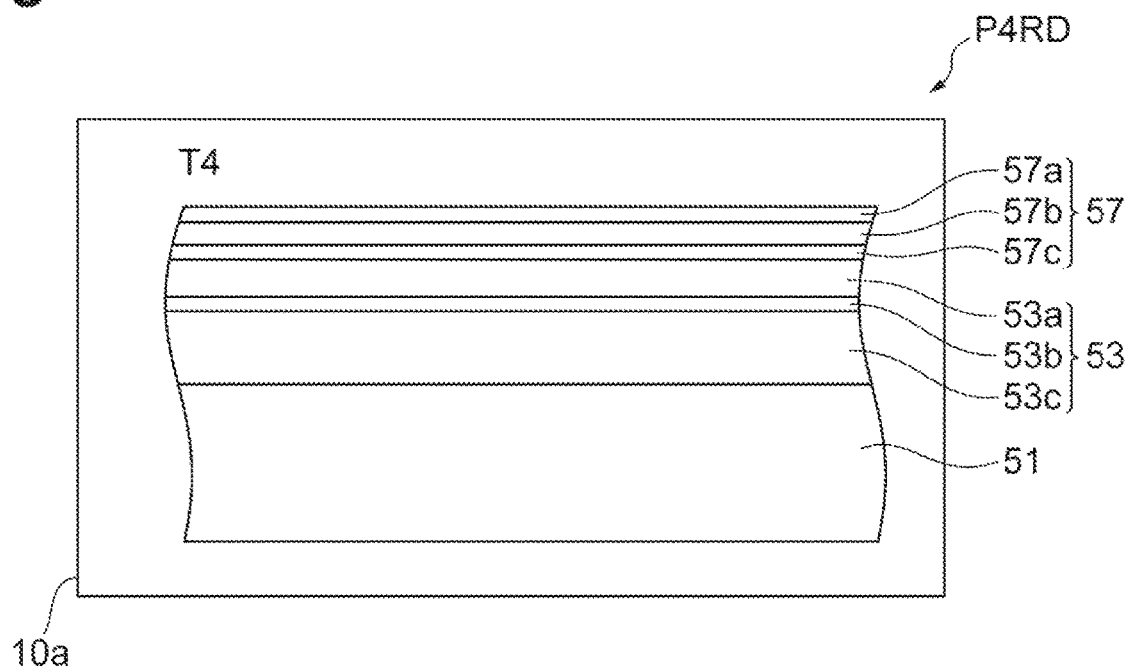
FIG. 4A is a schematic view showing a major step in the method according to the embodiment.

As shown in FIG. 4A, at the lower substrate temperature, the growth reactor 10a supplies a source gas containing an organometallic material to grow the semiconductor layer (57c) for the lower spacer region 17, specifically an undoped AlGaAs layer on the surface thereof. The lower substrate temperature is less likely to cause the migration of atoms than that in the growth of the lower laminate 53.

The semiconductor layer (57c) is, for example, an undoped Al(z)Ga(1-z)As layer (with a composition of 0.1<z<0.4) having a thickness of 5 to 25 nm, and this undoped AlGaAs layer has a surface roughness (e.g., 0.25 nm or less in root mean square (RMS), which is different from the surface steps of the lower laminate 53, at its top surface.

Exemplary growth condition of the semiconductor layer (57c).

Materials used for growth: TMAl, TMGa, and AsH$_3$.

Substrate temperature for growth: 570 to 590 degrees Celsius.

Molar ratio of group-V raw material to group-III raw material, V/III ratio: 100/160.

Growth rate: 0.4 to 0.7 nm/sec

The semiconductor layer (57c) forms an interface (41b) with the lower laminate 53 working as a basal semiconductor. Before growing the intermediate laminate, the lower laminate 53 has already been exposed to an arsenic atmosphere at a temperature lower than the growth temperature thereof during the growth interruption. On average, the semiconductor laminate (57c) has a carbon concentration of 2 to $5\times10^{16}$ cm$^{-3}$. Growth conditions that can bring the above carbon concentration (in a range of 2 to $5\times10^{16}$ cm$^{-3}$) to the semiconductor laminate (57) can give an RMS value of 0.25 nm or less to interfaces of the semiconductor laminate (57).

The semiconductor laminate (57b) for the quantum well structure MQW of the active layer 19 is grown with the substrate temperature unchanged. Specifically, semiconductor for a well layer is first deposited on the semiconductor layer (57c), and the following processes are repeated; depositing semiconductor for a barrier layer on the semiconductor layer for the well layer; and growing semiconductor for a well layer on the semiconductor layer.

Exemplary growth condition of the semiconductor laminate (57b)

Raw materials used for growth: TMAl, TMGa, TMIn (trimethylindium), and AsH$_3$.

Substrate temperature for growth: 570 to 590 degrees Celsius.

Molar ratio of group-V raw material to group-III raw material, V/III ratio: 100/160

Growth rate: 0.4 to 0.7 nm/sec

Semiconductor layer for well layer 19a: an Al composition of 0.01 to 0.08, an In composition of 0.08 to 0.18, and a thickness of 2 to 7 nm.

Semiconductor layer for barrier layer 19b: an Al composition of 0.1 to 0.4; and a thickness of 5 to 9 nm.

The semiconductor laminate (57b) forms an interface with the underlying semiconductor layer (57c). The semiconductor layer (57c) has an RMS value of, for example, 0.25 nm or less. The low growth temperature for the intermediate laminate 57 can also bring the RMS value of 0.25 nm or less to semiconductor for the well layer 19a grown on the basal semiconductor. The semiconductor laminate (57) contains a carbon concentration of $2\times10^{16}$ to $5\times10^{16}$ cm$^{-3}$ on average. Film deposition conditions that can bring the above carbon concentration to the semiconductor laminate (57) make it easy to keep an RMS value therein.

The substrate temperature is unchanged, and the growth reactor 10a supplies a raw material gas containing organometallic material for the upper spacer region 21 to grow the semiconductor layer (57a), for example, an undoped AlGaAs layer. The low substrate temperature is less likely to cause the migration of atoms in the same manner as the growth of the semiconductor layer (57c). The semiconductor layer (57a) can be, for example, an undoped Al(z)Ga(1-z)As layer (0.1<z<0.4) having a thickness of 5 to 25 nm.

Exemplary growth condition of the semiconductor layer (57a).

Materials used for growth: TMAl, TMGa, and AsH$_3$.

Substrate temperature for growth: 570 to 590 degrees Celsius.

Molar ratio of group-V and group-III raw materials, V/III ratio: 100/160.

Growth rate: 0.4 to 0.7 nm/sec

The semiconductor laminate (57a) contains a carbon concentration of 2 to $5\times10^{16}$ cm$^{-3}$ on average.

As understood from the above description, the growth of the intermediate laminate (the spacer region and the active layer) includes the following processes: supplying film-forming gas containing organometallic material to the growth reactor 10a to grow a first compound semiconductor layer containing Al as a group-III element and not containing In as a group-III element at a substrate temperature of 590 degrees Celsius or lower; and supplying film-forming gas containing organometallic material to the growth reactor 10a to grow a second compound semiconductor layer containing In as a group-III element at a substrate temperature of 590 degrees Celsius or lower.

Figure 4B:
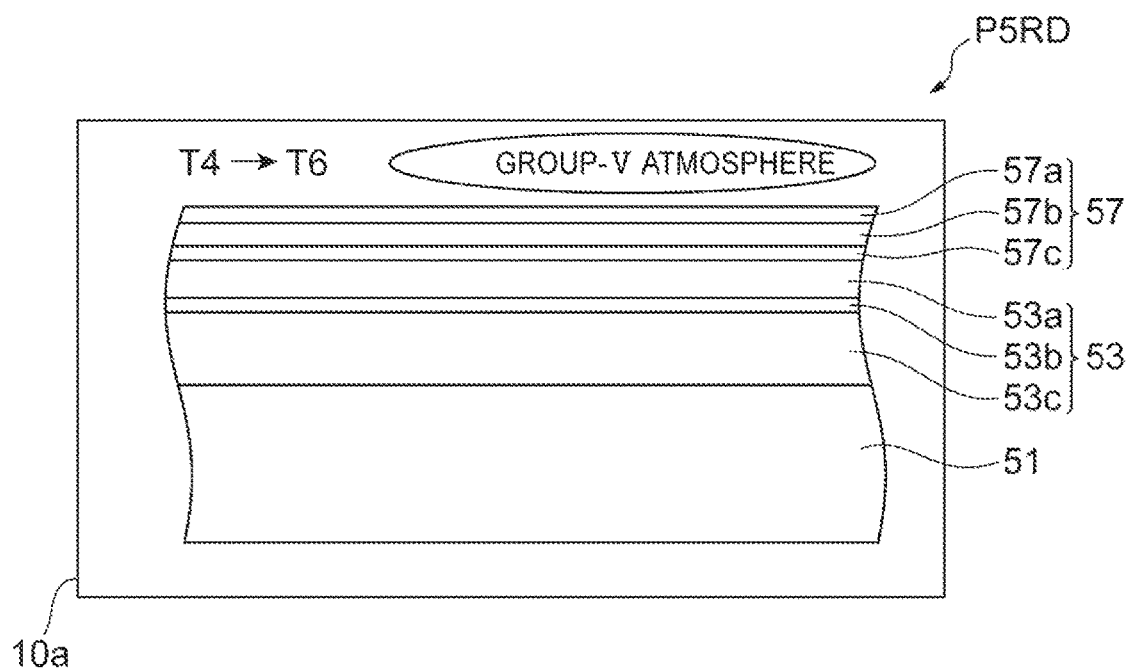
FIG. 4B is a schematic view showing a major step in the method according to the embodiment.

At time t4, the growth of the intermediate laminate 57 is brought to completion, and then, as shown in FIG. 4B, the growth interruption P5RD is used to prepare the next growth of the upper laminate 59 on the intermediate laminate 57. Specifically, the growth reactor 10a raises the substrate temperature from the growth temperature of 590 degrees Celsius or lower to the substrate temperature (T6) of 670 degrees Celsius or higher in the present embodiment. The growth reactor 10a supplies arsenic material without group-III organometallic material in the growth interruption to form an arsenic atmosphere therein.

Atmospheric gas: arsine as a group-V material. Temperature change rate: 10 to 30 degrees/min. Growth interruption period: 3 to 20 minutes.

Figure 5A:
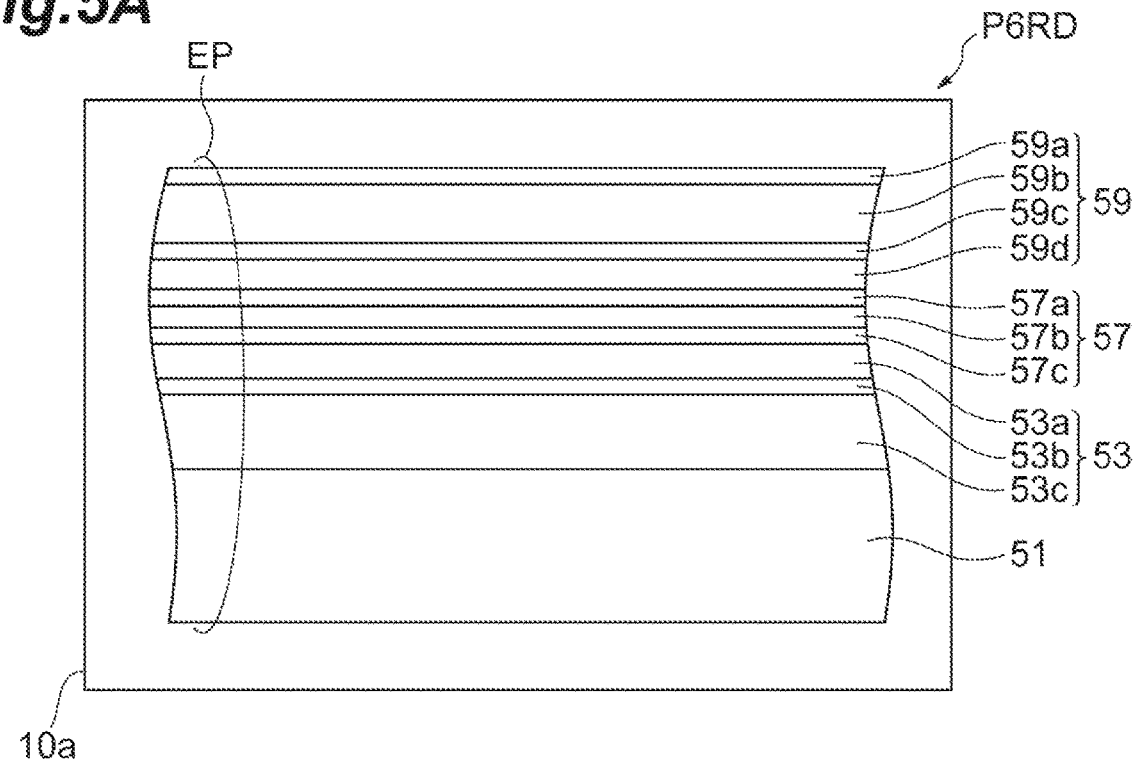
FIG. 5A is a schematic view showing a major step in the method according to the embodiment.

After the substrate temperature is raised to reach the target temperature in the period P6RD of the growth of the upper laminate (the upper laminate 27, the current confinement structure 25, the second upper laminate 29 and the upper contact layer 31), as shown in FIG. 5A, the growth reactor 10a starts to supply deposition gas containing the organic metal material to grow the upper laminate 59 at time t5, and the deposition reactor 10a switch the gas at time t6 to end the growth of the upper laminate 59. The upper laminate 59 includes semiconductor layers (59a, 59b, 59c, and 59d) for the upper contact layer 31, the first upper laminate 27, the current confinement structure 25, and the second upper laminate 29. Specifically, in the present embodiment, the upper laminate 59 includes, for example, a GaAs layer and/or an AlGaAs semiconductor layer. The semiconductor layer 59b is made of III-V compound semiconductor of high aluminum composition.

Exemplary growth condition

Substrate temperature for semiconductor crystal growth: 670 to 750 degrees Celsius.

Molar ratio of group-V to group-III raw materials, V/III ratio: 100/160.

Growth rate: 0.4 to 0.7 nm/sec

This growth condition allows the upper laminate 59, which contains semiconductor layers for the upper distributed Bragg reflector, to be grown on the intermediate laminate 57 at a substrate temperature of 670 degrees Celsius or more.

These steps bring an epitaxial substrate EP to completion.

The method for fabricating the vertical cavity surface emitting laser can provide the crystalline base for growth of the active layer with a low surface roughness which is made smaller than that of surface steps coining from a slight inclination of the principal surface of the substrate. Specifically, the growth of crystal at a substrate temperature of 590 degrees Celsius or less allows the crystal thus grown to have a surface roughness lower than the density and height of the surface steps of the principal surface of the substrate. The lower surface roughness itself can reduce difference in the non-uniform distribution of indium on the crystalline base. In addition, the indium-containing semiconductor of the well layer is grown on the crystalline base at a substrate temperature of 590 degrees Celsius or lower. The substrate temperature of 590 degrees Celsius or lower can suppress the migration of indium atoms during the growth to reduce an unevenness of indium in the indium-containing semiconductor. The low surface roughness of the crystalline base and the low migration during the growth can provide the indium-containing semiconductor of the well layer with a low segregation of indium. The well layer of the indium-containing semiconductor can prevent the indium segregation in the active layer from growing large under a long time of energization.

The intermediate laminate 57, which includes the semiconductor layers for the active layer, is provided with a carbon concentration ranging from $2\times10^{16}$ to $5\times10^{16}$ cm$^{-3}$. Carbon concentrations exceeding $5\times10^{16}$ cm$^{-3}$ prevent indium-containing semiconductors from having surface steps smaller than those the underlying layer to make the crystal quality degraded. Also, carbon concentrations of less than $2\times10^{16}$ cm$^{-3}$ reduce the incorporation of carbon in indium-containing semiconductors during the growth. The low incorporation capacity results from high decomposition of raw material at a high substrate temperature, so that surface steps associated with the slight inclination of the principal surface of the substrate is likely to be left on the top crystal thus grown. The carbon concentrations of $2\times10^{16}$ cm$^{-3}$ or more can provide the indium-containing semiconductor with a structure that can incorporate indium atoms such that progression of migration of indium atoms due to energization in the indium-containing semiconductor becomes slow to be less likely to change laser operation characteristics.

Figure 5B:
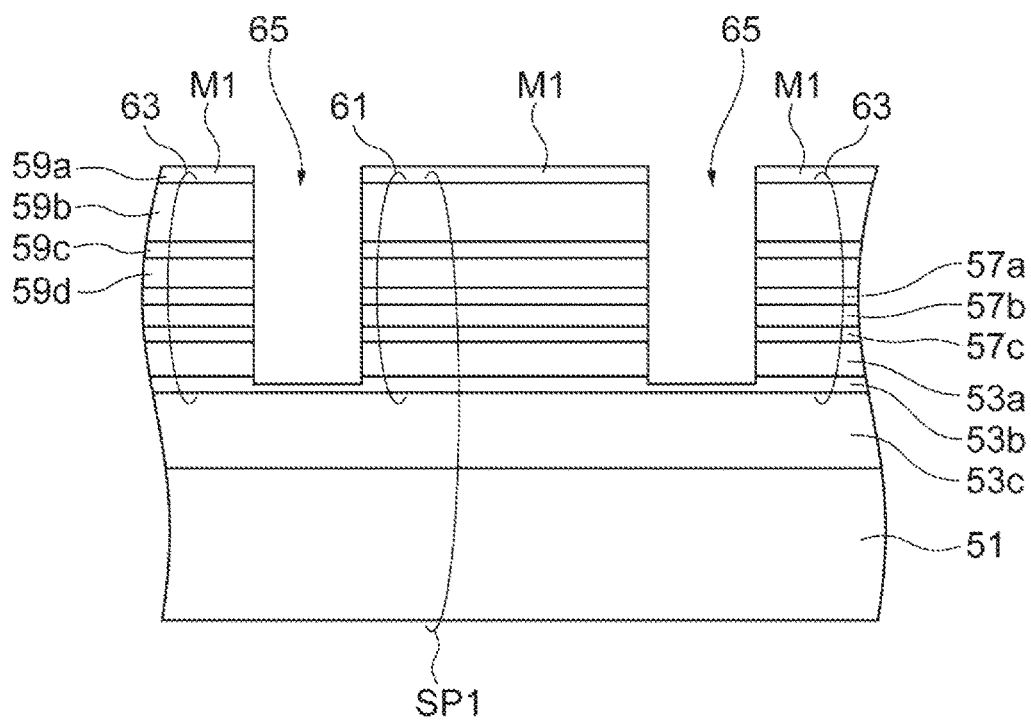
FIG. 5B is a schematic view showing a major step in the method according to the embodiment.

As shown in FIG. 5B, a mask M1, which defines the shape of the post, is formed on the principal face of the epitaxial substrate EP, and the epitaxial substrate EP is etched using the mask M1. The etching includes dry etching. The first substrate product SP1 includes a semiconductor post 61, a semiconductor terrace 63, and a groove 65 that separates the semiconductor post 61 from the semiconductor terrace 63. The semiconductor post 61 has a bottom in the semiconductor layer (53b) for the lower contact layer 39. After the etching, the mask M1 is removed to produce the first substrate product SP1.

Figure 6A:
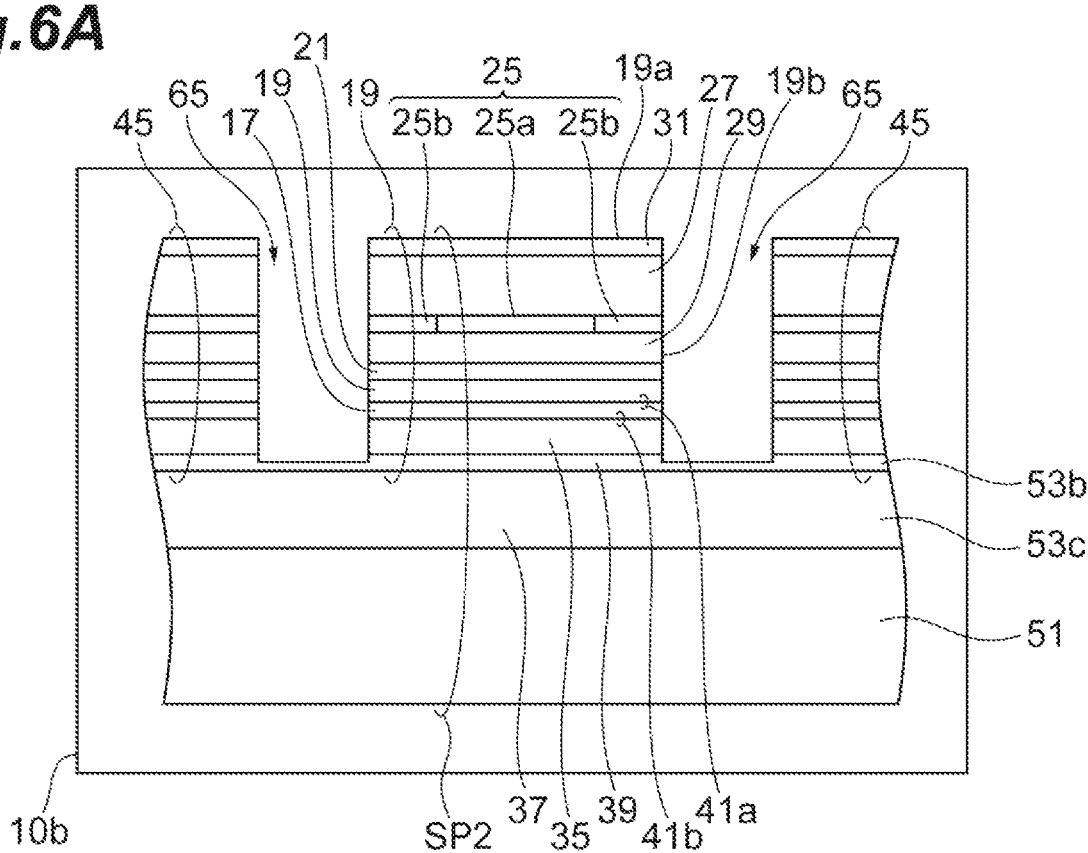
FIG. 6A is a schematic view showing a major step in the method according to the embodiment.

As shown in FIG. 6A, the first substrate product SP1 is placed in an oxidation reactor 10b, and the first substrate product SP1 is exposed to an oxidizing atmosphere (e.g., high-temperature steam at 350 degrees Celsius) to produce a current confinement structure 25 from the semiconductor layer 59c of high aluminum-containing III-V compound semiconductor of the first substrate product SP1. The oxidation reactor 10b processes the first substrate product SP1 to form a second substrate product SP2.

Figure 6B:
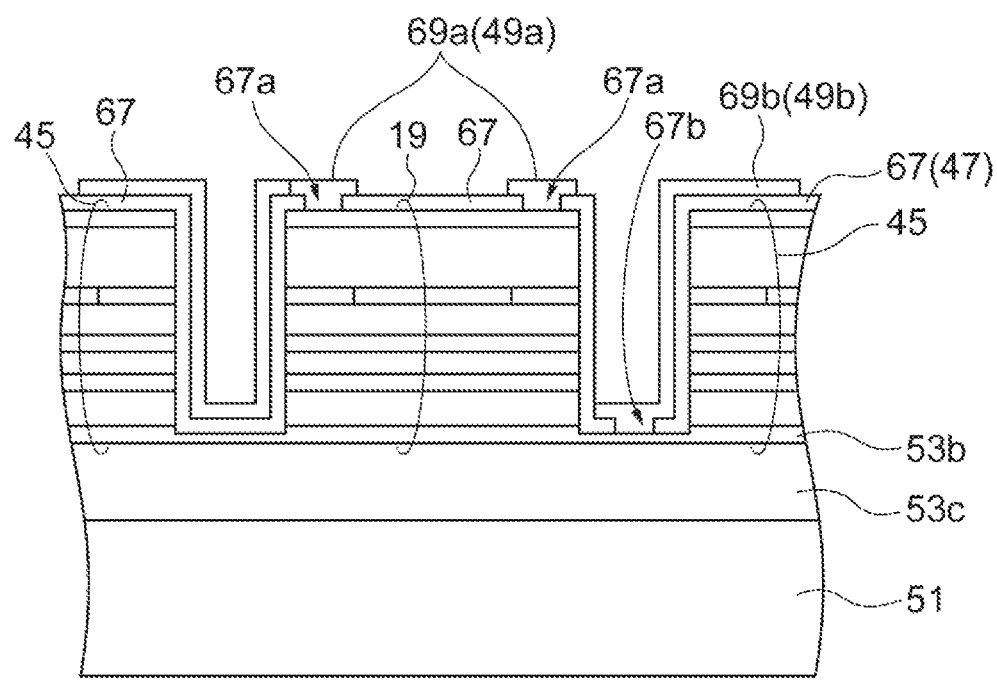
FIG. 6B is a schematic views each showing a major step in the method according to the embodiment.

As shown in FIG. 6B, a protective film 67 is formed on the second substrate product SP2 and has a first opening 67a and a second opening 67b. Thereafter, a first electrode 69a and a second electrode 69b are formed on the protective film.

These steps bring the vertical cavity surface emitting laser 11 to completion.

Figure 7A:
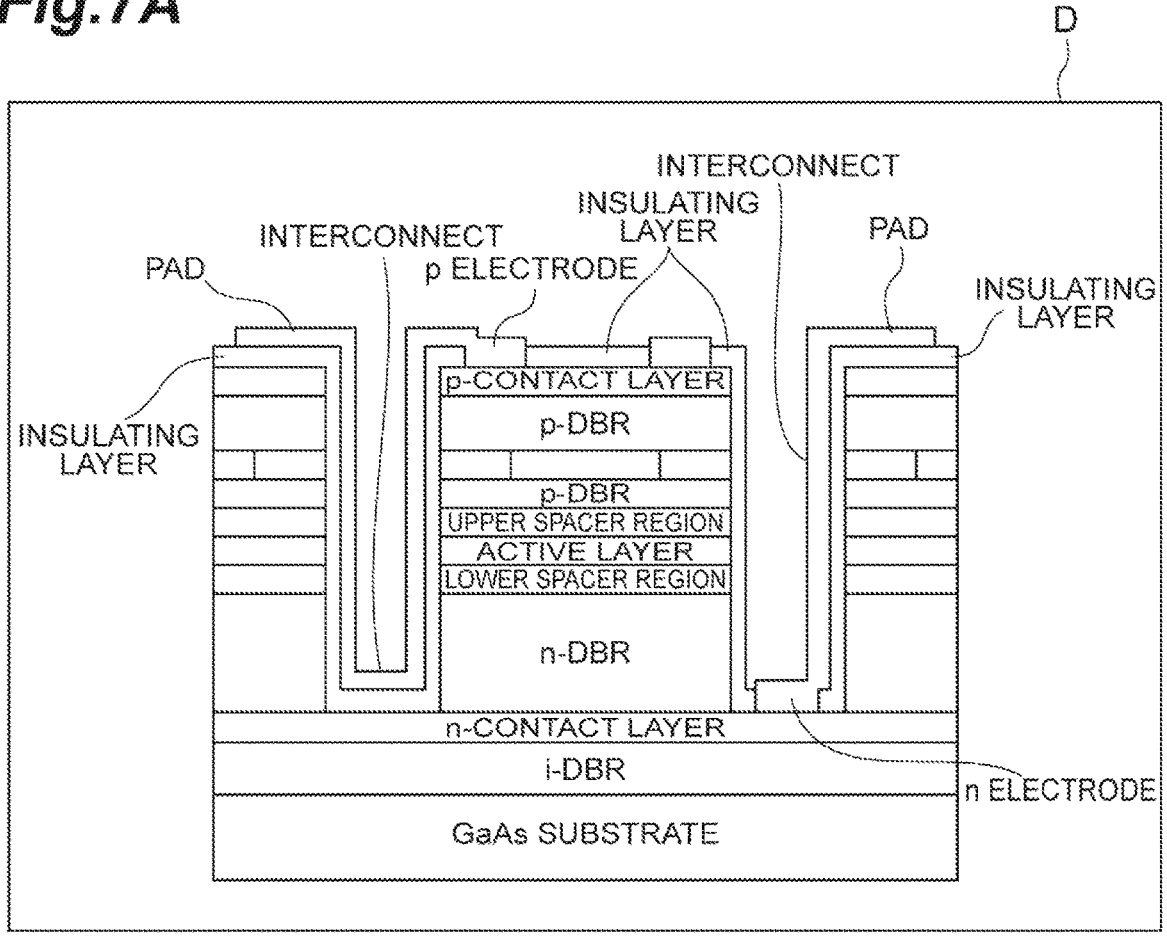
FIG. 7A is a schematic view showing the structure of a vertical cavity surface emitting laser according to an example.
Figure 7B:
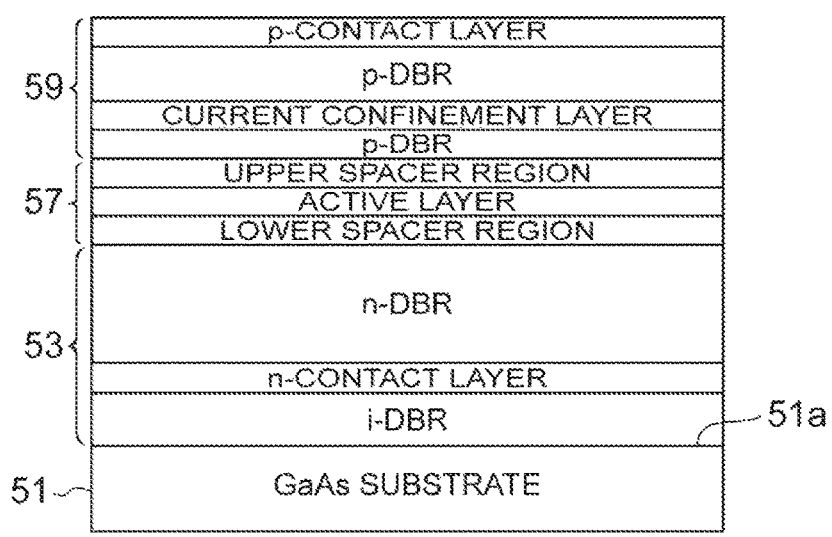
FIG. 7B is a schematic view showing an epitaxial substrate for the vertical cavity surface emitting laser according to the example.

FIGS. 7A and 7B are schematic views each showing a structure of a vertical cavity surface emitting laser according to an embodiment. In the embodiment, the vertical cavity surface emitting laser diode D shown in FIG. 7A is fabricated with a GaAs wafer having an off-angled principal surface (the principal surface that is inclined at an angle of, for example, 1 to 3 degrees with respect to the (001) plane in the direction of the <110> axis of the GaAs wafer), which is provided by the semiconductor substrate of the epitaxial substrate shown in FIG. 7B.

Figure 8:
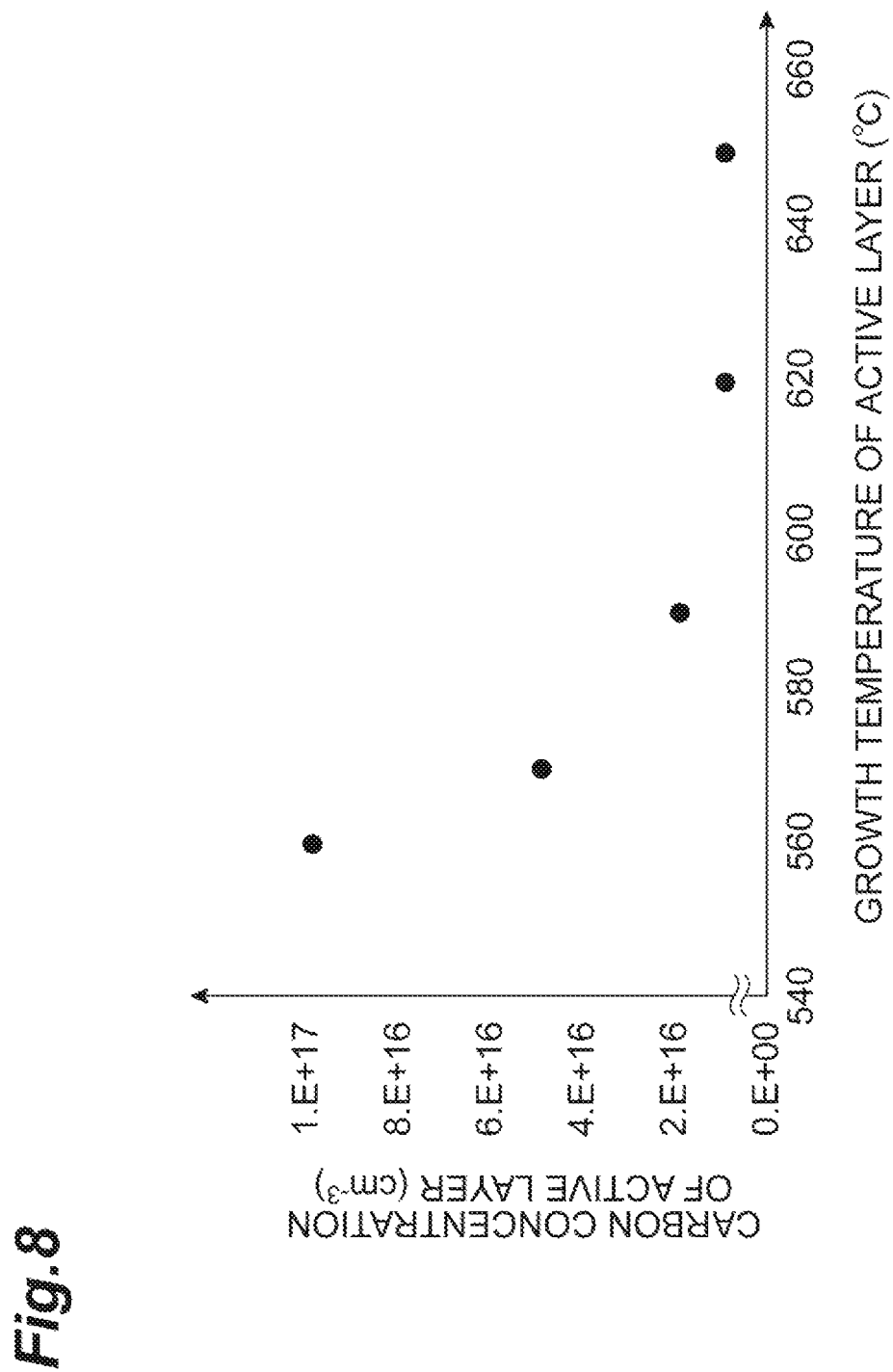
FIG. 8 is a graph showing the relationship between the growth temperature in the crystal growth of the lower spacer region, the active layer and the upper spacer region, and the carbon concentration in these semiconductor regions and layer in fabricating the vertical cavity surface emitting laser according to the example.
Figure 9:
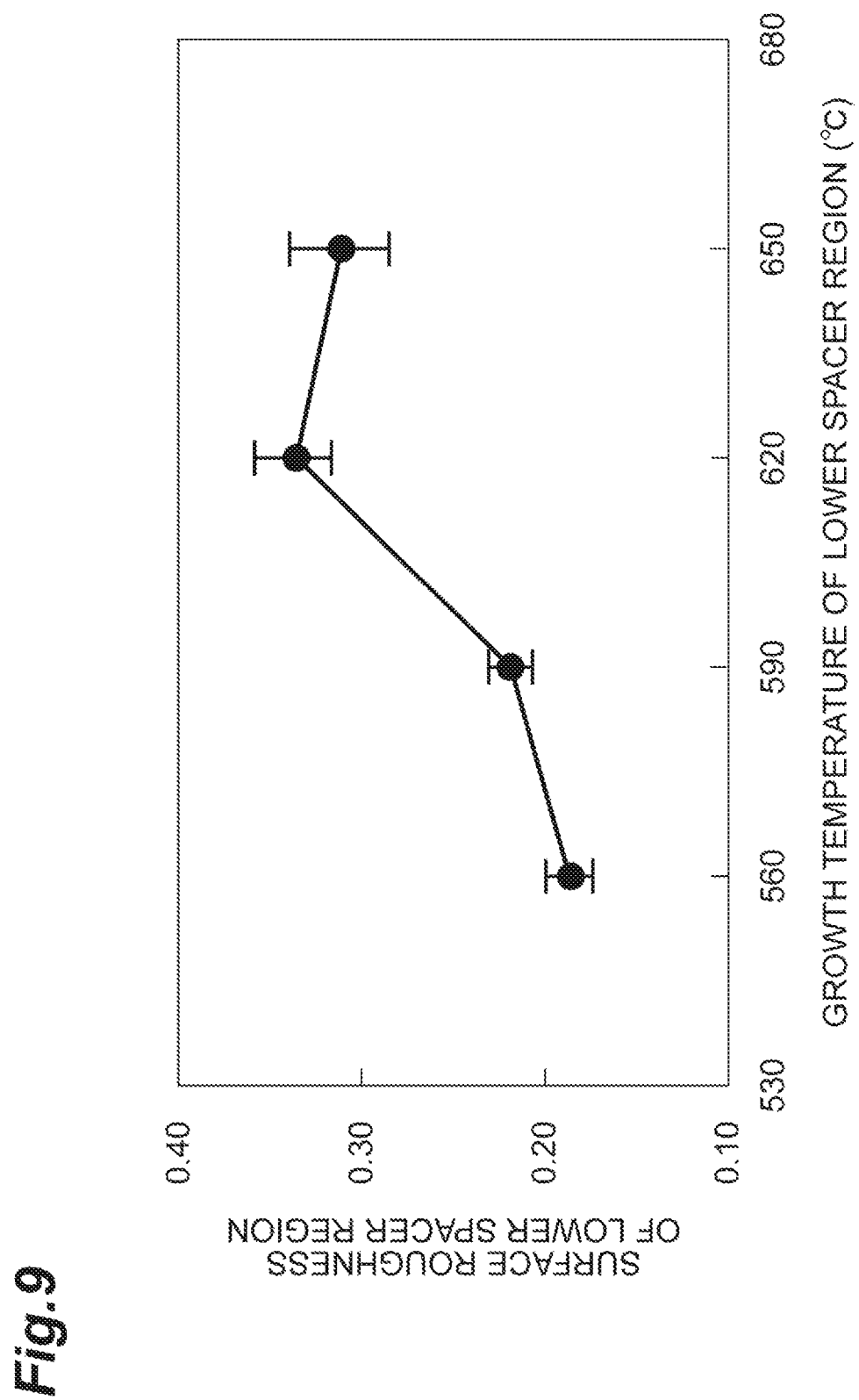
FIG. 9 is a graph showing the relationship between the growth temperature of the lower spacer region and the surface roughness (in RMS) of the upper surface of the lower spacer region, i.e., the base of the active layer in fabricating the vertical cavity surface emitting laser according to the example.

FIG. 8 is a graph showing the relationship between the growth temperature in the crystal growth of the lower spacer region, the active layer and the upper spacer region in fabricating the vertical cavity surface emitting laser D, and the carbon concentration in these semiconductor layers. Notation, for example, "2.E+16" in the carbon concentration represents $2\times10^{16}$. FIG. 9 is a view showing the relationship between the growth temperature of the lower spacer region in fabricating the vertical cavity surface emitting laser D and the surface roughness (an RMS value) of the upper face of the lower spacer region, i.e., the underlying layer that extends under the active layer. In the fabrication of a device that is used to measure the surface roughness of the lower spacer region, the lower spacer region is grown but the active layer is not grown thereon. More specifically, the lower spacer region is grown and then crystal growth is interrupted to form a desired epitaxial wafer. This desired epitaxial wafer is taken out from the reactor to measure the surface roughness of the lower spacer region of the epitaxial wafer with an atomic force microscope (AFM), and after the measurement, the epitaxial wafer is loaded again to grow the remaining crystal on the epitaxial wafer. In the fabrication of a device to measure the carbon concentration, the carbon concentration in the intermediate laminate of the epitaxial wafer (EP) is measured by secondary ion mass spectrometry (SIMS) to identify the carbon concentration of the semiconductor laminate (57b) for the active layer. Such a growth procedure does not change the growth recipe for grow the lower laminate.

The following devices D1V, D2V, D3V, D4V, and D5V are prepared by use of the above processes.

Device D1V: the growth temperature of the spacer region and the active layer is 650 degrees Celsius; the RMS value is 0.31 nm, the active layer has a carbon concentration of $1 \times 10^{16}$ cm$^{-3}$.

Device D2V: the growth temperature of the spacer region and the active layer is 620 degrees Celsius; the RMS value is 0.34 nm; and the active layer has a carbon concentration of $1 \times 10^{16}$ cm$^{-3}$.

Device D3V: the growth temperature of the spacer region and the active layer is 590 degrees Celsius; the RMS value is 0.22 nm; and the active layer has a carbon concentration of $2 \times 10^{16}$ cm$^{-3}$.

Device D4V: the growth temperature of the spacer region and the active layer is 570 degrees Celsius; the RMS value is 0.20 nm; and the active layer has a carbon concentration of $5 \times 10^{16}$ cm$^{-3}$.

Device D5V: the growth temperature of the spacer region and the active layer is 560 degrees Celsius; the RMS value is 0.19 nm; and the active layer has a carbon concentration of $1 \times 10^{17}$ cm$^{-3}$.

Devices D1V to D4V are subjected to a reliability test that can evaluate respective lifetimes at a current of 9 mA at a temperature of 90 degrees Celsius. "Lifetime" in this reliability test is defined as the cumulative time of operation in a period of the start of the reliability test to the first occurrence of a value in the slope efficiency (in dependence of the emission intensity on current) of the laser emission characteristics lower than a threshold, and the occurrence results from that the long-term energization makes the device degraded. The lifetimes of the devices D3V and D4V are 1.5 times longer than those of the devices D1V and D2V. The observation of a cross-section of the device D2V after the reliability test with a transmission electron microscope (TEM) shows that the active layer has several indium segregations (each of which has a slightly high indium concentration, as compared to that in the vicinity thereof), with a width of about several tens of nanometers. The observation of a cross-section of the device D2V after the reliability test with a transmission electron microscope (TEM) shows that the active layer has no indium segregation. Also, the observation of the devices D2V and D3V before the reliability test with a cross-sectional transmission electron microscope (TEM) shows that the active layer has no indium segregation. Before the reliability test, the device D5V exhibits a low laser light intensity of one second to one third as compared with initial optical intensities of the devices D1V to D4V.

Making the carbon concentration high may lower the initial emission intensity of lasing light. Increase in the carbon concentration is not preferable for the device characteristics in terms of the initial emission intensity of the laser light. Growing an active layer at a high temperature allows the active layer to have a low carbon concentration, leading to an excellent crystal quality of the active layer. But, the active layer with the low carbon concentration (which is formed at a high growth temperature) shows a large variation in slope efficiency.

The inventors' studies based on the above-mentioned experiment and other experiments show that the application of current to the devices causes indium segregation to progress in the active layers containing indium as a constituent element and that this progressing indium segregation is made slow by the lower spacer region that is grown by the low growth temperature. The inventors' further experiments reveal that the low temperature growth of the lower spacer region provides the lower spacer region with a surface roughness (RMS value) smaller than the lower spacer region that is grown at a higher temperature. This small surface roughness is due to a mechanism which differs from the growth at high temperatures that provides the crystal thus grown with a high quality.

The reason the small surface roughness can slow progression of In segregation during the energization is presumed to be due to the following mechanism. The surface of a GaAs substrate with a slightly tilted off has terraces and steps. The inventors estimate that the substrate has a surface roughness of about 0.3 nm in RMS on the off-surface. This RMS value is due to both a step structure coining from the arrangement of crystal faces on the off-angled surface of the substrate and surface roughness occurring accidentally. In the crystal growth of the lower laminate 53 using the high growth temperature, step-flow growth occurs. In the step-flow growth, the underlying step (slight surface step) is taken over to grow the crystal. Crystal growth using a high growth temperature creates terraces and steps on the surface of the lower laminate 53 that are associated with the slightly off-angled surface of the substrate.

Specifically, growing a lower spacer region on the lower laminate 53, which is grown at a high temperature, at a substrate temperature of 600 degrees Celsius or more provides the lower spacer region with a step-like structure coining from that of the base (the lower laminate). This association between their step-like structures cannot bring the top face of the lower spacer region an RMS value which is much smaller than that of the base. Growing the active layer on this face of the lower spacer region, which is provided with the step-like structure, at a temperature of 600 degrees Celsius or higher results in that indium atoms with an activation energy smaller than that of Ga atoms on the face are more likely to move on the terraces by surface diffusion to bottoms of the steps, thereby accumulating indium atoms thereat, and that the difference in migration between indium and gallium forms a slight difference between their distributions, so that the active layer thus grown is provided with a fluctuation in In composition.

The behavior of the device D2V in the reliability test result can be seen in the following way. The device thus formed is energized to generate the electric field or current, which is applied to the crystal of the active layer, thereby causing the indium atoms or ions, a part of which are accumulated at the bottoms of the steps, to migrate therein. The energization of the device for a long period of time develops bias of In atoms in the active layer to form a further indium segregation. The indium segregation that proceeds during operation varies the slope efficiency with respect to that of the initial characteristics.

Growing the lower spacer region at a low temperature makes the migration of atoms on the face less-active during the crystal growth. The less-active migration of atoms also makes it difficult to take over the steps of the underlying layer during the growth, thereby providing the lower spacer region with a slightly-reduced RMS value. The lower spacer region thus grown has a smaller step density than that of the top face of the lower laminate 53. It seems that growing well layers on the crystal, which has a step density (which measurable as the roughness of the interface between the lower spacer region 17 and the active layer 19) smaller than that of the underlying region (measurable as the roughness of the interface between the first lower laminate 35 and the lower spacer region 17), allows indium deviation to hardly occur in the growth of the active layer.

The use of non-off surface of the substrate makes it difficult to control a step-like structure which may be influenced by accidental factors during the growth. An off-angled substrate is used to grow crystal thereon under a growth condition enabling an RMS value and a step density of the crystal thus grown which are smaller than those of a layer underlying the active layer, thereby slowing the indium segregation progressing owing to the long-term energization. The vertical cavity surface emitting laser fabricated in this manner has a small bias in the indium distribution of the active layer, and the small bias of the indium distribution is associated with the carbon concentration in a certain range.

The present embodiment can provide a vertical cavity surface emitting laser with an improved reliability, and can provide a method for fabricating a vertical cavity surface emitting laser with improved reliability.

Having described and illustrated the principle of the invention in a preferred embodiment thereof, it is appreciated by those having skill in the art that the invention can be modified in arrangement and detail without departing from such principles. We therefore claim all modifications and variations coining within the spirit and scope of the following claims.

What is claimed is:

1. A vertical cavity surface emitting laser comprising:
   a supporting base having a principal surface including III-V compound semiconductor containing gallium and arsenic as constituent elements; and
   a post disposed on the principal surface,
   the post having a lower spacer region and an active layer,
   the lower spacer region including III-V compound semiconductor containing gallium and arsenic as group-III elements,
   the active layer having a quantum well structure disposed on the lower spacer region,
   the quantum well structure having a concentration of carbon in a range of $2 \times 10^{16}$ cm$^{-3}$ or more to $5 \times 10^{16}$ cm$^{-3}$ or less,
   the quantum well structure including a well layer and a barrier layer,
   the well layer including III-V compound semiconductor containing indium as a group-III element,
   the barrier layer including III-V compound semiconductor containing indium and aluminum as group-III elements, and
   the lower spacer region being disposed between the supporting base and the active layer.

2. The vertical cavity surface emitting laser according to claim 1, further comprising a lower laminate having semiconductor layers for a lower Bragg distributed reflector disposed on the supporting base,
   the principal surface of the supporting base including GaAs,
   the lower laminate being disposed between the lower spacer region and the supporting base,
   the lower spacer region being in contact with the lower laminate, and
   the III-V compound semiconductor of the lower spacer region including an AlGaAs layer in contact with the active layer.

3. The vertical cavity surface emitting laser according to claim 1, wherein the quantum well structure has an AlGaInAs well layer and an AlGaAs barrier layer.

4. A method for fabricating a vertical cavity surface emitting laser comprising:
   preparing a substrate including III-V compound semiconductor containing gallium and arsenic as constituent elements;
   growing a semiconductor laminate for a lower Bragg distributed reflector on a principal surface of the substrate at a substrate temperature of 670 degrees Celsius or more;
   supplying a raw material containing organometallic material to a growth reactor to grow a first semiconductor layer on the semiconductor laminate at a substrate temperature of 590 degrees Celsius or less, the first semiconductor layer containing aluminum as a group-III constituent element and not containing indium as a group-III constituent element; and
   supplying a raw material containing organometallic material to a growth reactor to grow a second semiconductor layer for an active layer on the first semiconductor layer at a substrate temperature of 590 degrees Celsius or less, the second semiconductor layer containing indium as a group-III constituent element.

5. The method according to claim 4, wherein the active layer has a concentration of carbon ranging from $2 \times 10^{16}$ cm$^{-3}$ to $5 \times 10^{16}$ cm$^{-3}$.

* * * * *